(12) United States Patent
Sidman

(10) Patent No.: US 9,470,764 B2
(45) Date of Patent: Oct. 18, 2016

(54) MAGNETIC FIELD SENSING APPARATUS AND METHODS

(75) Inventor: Alan L. Sidman, Shrewsbury, MA (US)

(73) Assignee: Hercules Technology Growth Capital, Inc., Palo Alto, CA (US)

( * ) Notice: Subject to any disclaimer, the term of this patent is extended or adjusted under 35 U.S.C. 154(b) by 1030 days.

(21) Appl. No.: 13/328,635

(22) Filed: Dec. 16, 2011

(65) Prior Publication Data

US 2013/0141090 A1    Jun. 6, 2013

Related U.S. Application Data

(60) Provisional application No. 61/566,895, filed on Dec. 5, 2011.

(51) Int. Cl.
*G01R 33/09* (2006.01)
*G01R 33/00* (2006.01)

(52) U.S. Cl.
CPC .......... *G01R 33/093* (2013.01); *G01R 33/0011* (2013.01); *G01R 33/096* (2013.01)

(58) Field of Classification Search
CPC ............ G01R 33/063; G01R 33/0005; G01R 33/0011
See application file for complete search history.

(56) References Cited

U.S. PATENT DOCUMENTS

| | | | |
|---|---|---|---|
| 5,583,725 A | 12/1996 | Coffey et al. | |
| 5,729,410 A | 3/1998 | Fontana, Jr. et al. | |
| 5,920,446 A | 7/1999 | Gill | |
| 6,384,600 B1 | 5/2002 | Coehoorn | |
| 6,501,678 B1 * | 12/2002 | Lenssen et al. | 365/173 |
| 6,633,462 B2 * | 10/2003 | Adelerhof | 360/315 |
| 6,961,225 B2 | 11/2005 | Gill | |
| 7,054,114 B2 | 5/2006 | Jander et al. | |
| RE39,799 E | 8/2007 | Schwarzl | |
| 2004/0137275 A1 | 7/2004 | Jander et al. | |
| 2008/0309331 A1 | 12/2008 | Qian et al. | |
| 2009/0289626 A1 * | 11/2009 | Iben | 324/252 |
| 2010/0007223 A1 * | 1/2010 | Denne | 310/12.22 |
| 2010/0007339 A1 * | 1/2010 | Ausserlechner | G01P 3/487 324/207.21 |
| 2010/0007343 A1 * | 1/2010 | Mao | G01R 33/063 324/249 |
| 2010/0072992 A1 | 3/2010 | Bauer | |

FOREIGN PATENT DOCUMENTS

| | | |
|---|---|---|
| DE | 69932800 T2 | 8/2007 |
| EP | 0687917 A2 | 12/1995 |
| EP | 0724302 A1 | 7/1996 |
| FR | 2752302 A1 | 2/1998 |
| WO | 00/10023 A1 | 2/2000 |

OTHER PUBLICATIONS

International Preliminary Report on Patentability from the International Searching Authority, date of mailing Mar. 4, 2014, from the Parent PCT/US2011/065533, filed on Dec. 16, 2011.

(Continued)

*Primary Examiner* — Tung X Nguyen
*Assistant Examiner* — Adam Clarke
(74) *Attorney, Agent, or Firm* — Janine M. Susan; Burns & Levinson, LLP

(57) ABSTRACT

Magnetic field sensor designs that provide both increased directionality and proximate coupling desirable for improved directionality and sensitivity and methods for fabricating them.

18 Claims, 9 Drawing Sheets

(56) References Cited

OTHER PUBLICATIONS

International Search Report dated Nov. 24, 1999 from International Patent Application PCT/EP2011/005602.

Tondra, M. et al. "Picotesla Field Sensor Design Using Spin-Dependent Tunneling Devices." J. Appl. Phys. 83 (11), 6688-6690 (1998).

Parkin, S. et al. "Magnetically Engineered Spintronic Sensors and Memory," Proc. IEEE, 91(5), May 2003: 661-680.

Lenz, J. et al. "Magnetic Sensors and Their Applications," IEEE Sensors Journal 6(3), Jun. 2006: 631-649.

International Search Report dated Mar. 27, 2012 from international Parent Application PCT/US2011/065533.

Written Opinion of the International Searching Authority dated Mar. 27, 2012 from international Parent Application PCT/US2011/065533.

* cited by examiner

MAGNETIC FIELD SENSING APPARATUS AND METHODS

CROSS REFERENCE TO RELATED APPLICATION

The present application claims priority to U.S. Provisional Application No. 61/566,895, filed on Dec. 5, 2011, and entitled "MAGNETIC FIELD SENSING APPARATUS AND METHODS," which is incorporated by reference herein in its entirety and for all purposes.

BACKGROUND

These teachings relate generally to magnetic field sensing, and, more particularly, to directional magnetic field sensing.

Magnetic field sensing is utilized in a wide array of end-applications including linear and rotary motion sensing, magnetic switches, current sensors, and compassing. These sensors find use in automotive, industrial, medical and consumer end-markets.

Magnetic field sensors may operate by inductive coupling or direct magnetic coupling between a localized magnetic or geomagnetic field and a ferromagnetic or semiconducting magnetic sensor material. These sensors may utilize a variety of sensing methods, including the Hall-effect, anisotropic, giant or tunneling magneto-resistive effects among others.

Sensors may be designed to couple to magnetic fields in a single orientation or in multiple orientations. Sensor may utilize ferromagnetic flux-concentrators to improve the coupling of external magnetic fields to the sensor. This increases the magnetic field injected into the sensor and boosts the sensor response.

The use of a single planar flux-concentrator to inject external magnetization into horizontal and vertical semiconductor Hall-effect magnetic sensors has been previously described as well as the use of a ring or disc shaped planar flux concentrator. The use of a planar flux concentrator and a MEMS electrostatic actuator to change the positional coupling of the flux-concentrator to the sensor, modulating the flux-coupling has also been previously described. The use of a flux-concentrator/flux-shield combination in a Wheatstone bridge sensor configuration, wherein two bridge resistor elements are shielded reference magneto-resistors and two bridge resistor elements are sensing magneto-resistors has been previously described. The (multilayer GMR) elements are differentially processed to obtain a net signal output. The flux-concentrator, in proximity to the ends of the magneto-resistor element, provides signal gain.

One drawback of each of these flux-concentrator designs is that they provide generalized magnetic field concentration with little specific vector selectivity. The round or disc-shaped flux concentrators collect magnetization from numerous or all vector orientations. While this does boost signal it does not boost specific vector orientation signals essential for many magnetic sensing applications.

Additionally, generalized proximity of the conventional flux-concentrator designs does not provide the maximum potential flux-coupling possible with fully proximate designs. Thus, maximum signal gain or increased sensitivity is not obtained with prior-art designs.

There is a need for designs that provide both increased directionality and proximate coupling desirable for improved directionality and sensitivity magnetic field sensors.

BRIEF SUMMARY

Embodiments of magnetic field sensor designs that provide both increased directionality and proximate coupling desirable for improved directionality and sensitivity and methods for fabricating them are disclosed herein below.

In one embodiment, the magnetic field sensing component of these teachings includes an array of line elements, each line element being a magnetic field sensing structure, first connecting elements, each first connecting element positioned to connect first ends of two adjacent line elements, second connecting elements, each second connecting element positioned to connect opposite ends of the two adjacent line elements to a respective oppositely adjacent line element, and an array of flux concentrating structures; each one flux concentrating structure being disposed between two line elements.

One embodiment of the method for fabricating a magnetic field sensing component includes depositing a number of magnetic field sensing structures as line elements in an array of magnetic field sensing structures, patterning and depositing conductor elements to connect first and second ends of adjacent line elements; the connecting elements connecting the first and second ends of the adjacent line elements in order to form a substantially serpentine structure, depositing a dielectric layer to provide isolation between the magnetic field sensing structures, patterning and etching deposition vias in the dielectric layer and patterning and depositing a number of flux concentrator structures, one flux concentrator structure being deposited between each two adjacent line elements.

One embodiment of the sensor of these teachings includes two reference resistor elements, two magneto-resistor elements, each magneto-resistor element comprising an array of line elements, each line element being a magnetic field sensing structure, first connecting elements, each first connecting element positioned to connect first ends of two adjacent line elements, second connecting elements, each second connecting element positioned to connect opposite ends of the two adjacent line elements to a respective oppositely adjacent line element, and an array of flux concentrating structures; each one flux concentrating structure being disposed between two line elements. The above embodiment of the sensor also includes a flux concentrating/shielding structure, the flux concentrating/shielding structure disposed over the two reference resistor elements in order to substantially shield the two reference resistor elements from external fields, the two magneto-resistor elements being disposed between one portion of the flux concentrating/shielding structure and another portion of the flux concentrating/shielding structure, some of the flux concentrating structures from the array of flux concentrating structures in each magneto-resistor element being operatively connected to one portion the flux concentrating/shielding structure and some others of the flux concentrating structures from the array of flux concentrating structures in each magneto-resistor element being operatively connected to the other portion of the flux concentrating/shielding structure. The two reference resistor elements and the two magneto-resistor elements are connected to form a Wheatstone Bridge configuration, each of arm of the Wheatstone Bridge comprising one reference resistor and one magneto-resistor element. Output of the Wheatstone Bridge is provided by a voltage between points of connection of the reference resistor element and the magneto-resistor element in each arm of the Wheatstone Bridge.

A number of other embodiments are also disclosed.

For a better understanding of the present teachings, together with other and further objects thereof, reference is made to the accompanying drawings and detailed description and its scope will be pointed out in the appended claims.

DETAILED DESCRIPTION

Figure 1:
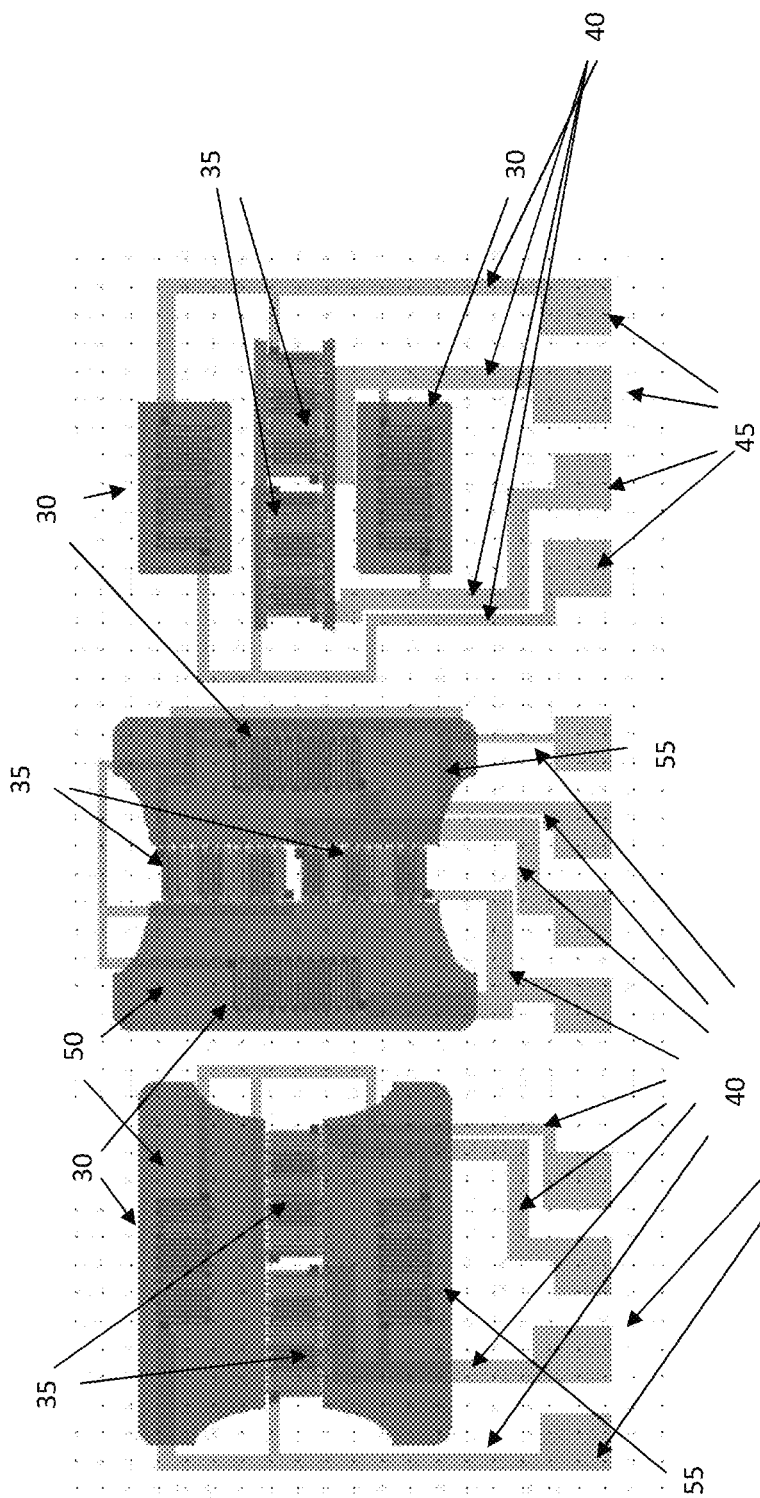
FIG. 1 depicts one embodiment of the system of these teachings.

The following detailed description is of the best currently contemplated modes of carrying out these teachings. The description is not to be taken in a limiting sense, but is made merely for the purpose of illustrating the general principles of these teachings, since the scope of these teachings is best defined by the appended claims. Although the teachings have been described with respect to various embodiments, it should be realized these teachings are also capable of a wide variety of further and other embodiments within the spirit and scope of the appended claims.

As used herein, the singular forms "a," "an," and "the" include the plural reference unless the context clearly dictates otherwise.

A "magneto-resistor element," as used herein is an element whose voltage-current characteristic changes due to being in the presence of a magnetic field.

A "serpentine" configuration or structure, as used herein, refers to a structure having an array of elements connected such that in going from one element to another element a winding path is followed. Such a serpentine structure includes the array of elements and the connecting element from one element to a next element.

Except where otherwise indicated, all numbers expressing quantities of ingredients, reaction conditions, and so forth used in the specification and claims are to be understood as being modified in all instances by the term "about."

One embodiment of the sensor of these teachings includes two reference resistor elements, two magneto-resistor elements, each magneto-resistor element comprising an array of line elements, each line element being a magnetic field sensing structure, first connecting elements, each first connecting element positioned to connect first ends of two adjacent line elements, second connecting elements, each second connecting element positioned to connect opposite ends of the two adjacent line elements to a respective oppositely adjacent line element, and an array of flux concentrating structures; each one flux concentrating structure being disposed between two line elements. The above embodiment of the sensor also includes a flux concentrating/shielding structure, the flux concentrating/shielding structure disposed over the two reference resistor elements in order to substantially shield the two reference resistor elements from external fields, the two magneto-resistor elements being disposed between one portion of the flux concentrating/shielding structure and another portion of the flux concentrating/shielding structure, some of the flux concentrating structures from the array of flux concentrating structures in each magneto-resistor element being operatively connected to one portion the flux concentrating/shielding structure and some others of the flux concentrating structures from the array of flux concentrating structures in each magneto-resistor element being operatively connected to the other portion of the flux concentrating/shielding structure. The two reference resistor elements and the two magneto-resistor elements are connected to form a Wheatstone Bridge configuration, each of arm of the Wheatstone Bridge comprising one reference resistor and one magneto-resistor element. Output of the Wheatstone Bridge is provided by a voltage between points of connection of the reference resistor element and the magneto-resistor element in each arm of the Wheatstone Bridge.

The magneto-resistor element can be, but is not limited to, a giant magneto resistance (GMR) sensor (see, for example, U.S. Pat. No. 6,961,225 or Xiao et al., Phys. Rev. Letters, Vol. 68, No. 25, pp. 3749-3752, 22 Jun. 1992, both of which are Incorporated by reference herein in their entirety for all purposes), a GMR-spin valve sensor (having a pinned layer, see for example, U.S. Pat. No. 5,920,446, U.S. Pat. No. 5,583,725, D. E. Heim, Design and Operation of Spin Valve Sensors, IEEE Transactions On Magnetics, Vol. 30, No. 2, March 1994, pp. 316-321, all of which are Incorporated by reference herein in their entirety and for all purposes) or a magnetic tunneling junction (MJT) sensor (see, for example, U.S. Pat. No. 5,650,958, which is Incorporated by reference herein in its entirety and for all purposes).

In one instance, a width of each flux concentrating structure from the array of flux concentrating structures is selected to substantially optimize sensitivity of the magnetic field sensing component (sensitivity=$\Delta$output/$\Delta$H, where H is the magnetic field strength). For the exemplary embodiment disclosed herein below, the width of the flux concentrating structure does not appear to have of a in the range analyzed, 4-8 um. At narrow widths, the flux concentrating structure will suffer from increased shape-demagnetization field effects which will cause domain-related restrictions to flux-conduction down the flux concentrating structure. It is likely that in flux concentrating structures of with 2 um or narrower, there may be some strong shape-demagnetization effects making those flux concentrating structures much less effective, particularly at low external fields (such as earth's field in compassing sensors). At high fields, such as motor encoders with permanent magnets attached at the rotor ends, the useful lower range of flux concentrating structure widths may be extended slightly.

In another instance, a thickness of each flux concentrating structure is selected to substantially optimize sensitivity of the magnetic field sensing component. In yet another instance, a spacing between each one flux concentrating structure and each one of the two line elements adjacent to said one flux concentrating structure is selected to substantially optimize sensitivity of the magnetic field sensing component. The magnitude of flux-concentration increases with flux-concentrator thickness (flux concentration increases with area and volume of material to capture external field magnetization). The exemplary embodiment disclosed herein below has a preferred value for X and Y axis devices being in the 5 um thickness range. For Z-axis devices, the preferred value is in the 5-10 um range, capturing z-axis field and directing it down (stove-piping it) to the sensor element.

In another embodiment, each one flux concentrating structure is offset from each one of the two line elements adjacent to said one flux concentrating structure. The smaller the offset, the better the coupling between the flux-concentrator and the sensing element since the field strength drops exponentially with offset distance.

For one exemplary embodiment, a summary of the parameters analyzed is given in Table below.

TABLE 1

| CASE ID | Flux-Concentrator Thickness | Flux-Concentrator Finger Width | Offset of Flux-Concentrators from the GMR Sensor stripes |
|---|---|---|---|
| Case A | 1 μm | 4 μm | 1 μm |
| Case B | 2 μm | 4 μm | 1 μm |
| Case C | 3 μm | 4 μm | 1 μm |
| Case D | 5 μm | 4 μm | 1 μm |
| Case E | 7 μm | 4 μm | 1 μm |
| Case F | 10 μm | 4 μm | 1 μm |
| Case G | 3 μm | 6 μm | 1 μm |
| Case H | 3 μm | 8 μm | 1 μm |
| Case I | 3 μm | 6 μm | 2 μm |
| Case J | 3 μm | 6 μm | 3 μm |

FIG. 1 depicts one specific embodiment of the sensor of these teachings. This is a tri-axis magnetic compassing sensor showing separate y, x and z-axis sensors each in a Wheatstone bridge configuration. Each sensor has two reference magneto-resistor elements 30 and two sensing magneto-resistor elements 35 connected by conductors 40 and terminated in bond pads 45 for external wiring connection. The flux-concentrators 50, 55 act as magnetic shields to the reference magneto resistors buried beneath them. The flux-concentrators are wide at the top (remote from the sensing magneto-resistors) and narrow at the end near the sensing magneto-resistors, providing flux-concentration. The flux concentrator narrow ends are proximate to and interleaved with the sensing magneto-resistors, providing maximum directional coupling from external field to the sensing elements.

Figure 2:
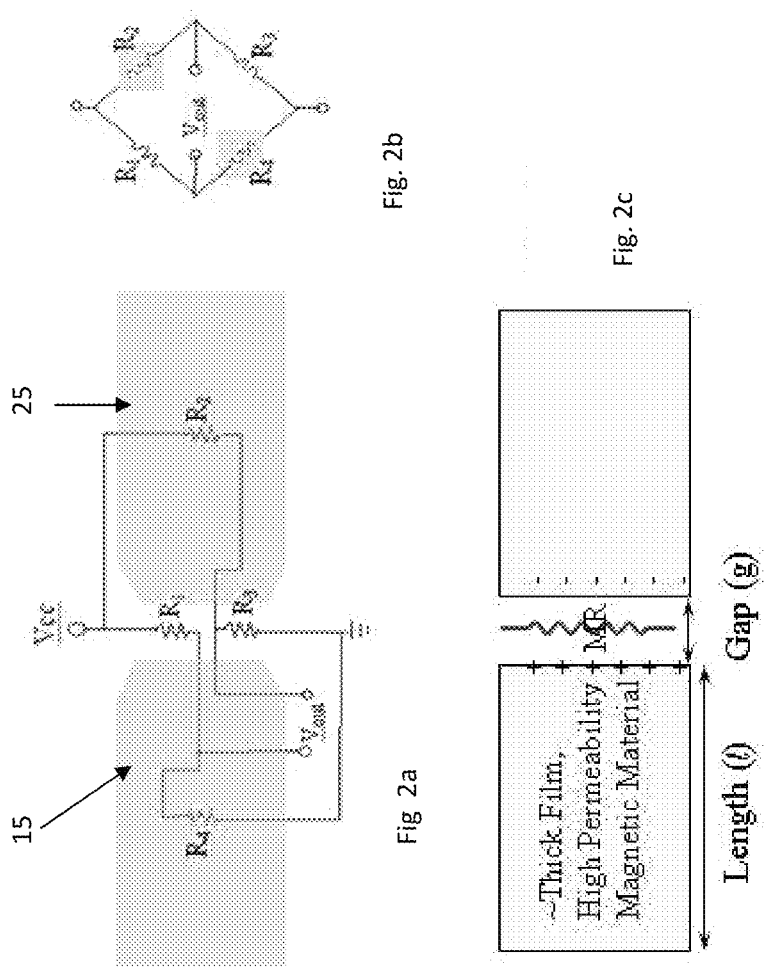
FIGS. 2a-2c show a schematic circuit diagram representation of a Wheatstone Bridge configuration of embodiments of the system of these teachings.

FIGS. 2a-2c show a circuit diagram for the Wheatstone bridge sensor where $R_1$ and $R_3$ are sensing magneto-resistors and $R_2$ and $R_4$ are shielded reference magneto-resistors. A generalized combination flux-concentrator/flux-shield is shown overlaying or proximate to the reference and sensing magneto-resistive elements, respectively. Referring to FIG. 2a, magneto-resistors $R_1$ and $R_4$ are connected in series with magneto-resistor $R_4$ being shielded by a shielding/flux concentrating component 15 and magneto-resistors $R_2$ and $R_3$ are connected in series with magneto-resistor $R_2$ being shielded by a shielding/flux concentrating component 25. The series connection of magneto-resistors $R_1$ and $R_4$ is connected in parallel with this series connection of magneto-resistors $R_2$ and $R_3$. FIG. 2b shows the circuit schematic for the Wheatstone Bridge configuration. Output of the Wheatstone Bridge is provided by a voltage between points of connection of the reference shielded magneto-resistor and the sensing (unshielded) magneto-resistor in each arm of the Wheatstone Bridge. FIG. 2c shows the flux concentration effect. In one instance, the concentration ratio can be approximated by the ratio of the length of the flux concentrator to the gap between the two flux concentrators. In another instance, the expression for the concentration ratio includes the effects of flux concentrator thickness.

In one embodiment, the magnetic field sensing component of these teachings includes an array of line elements, each line element being a magnetic field sensing structure, first connecting elements, each first connecting element positioned to connect first ends of two adjacent line elements, second connecting elements, each second connecting element positioned to connect opposite ends of the two adjacent line elements to a respective oppositely adjacent line element, and an array of flux concentrating structures; each one flux concentrating structure being disposed between two line elements.

Figure 3:
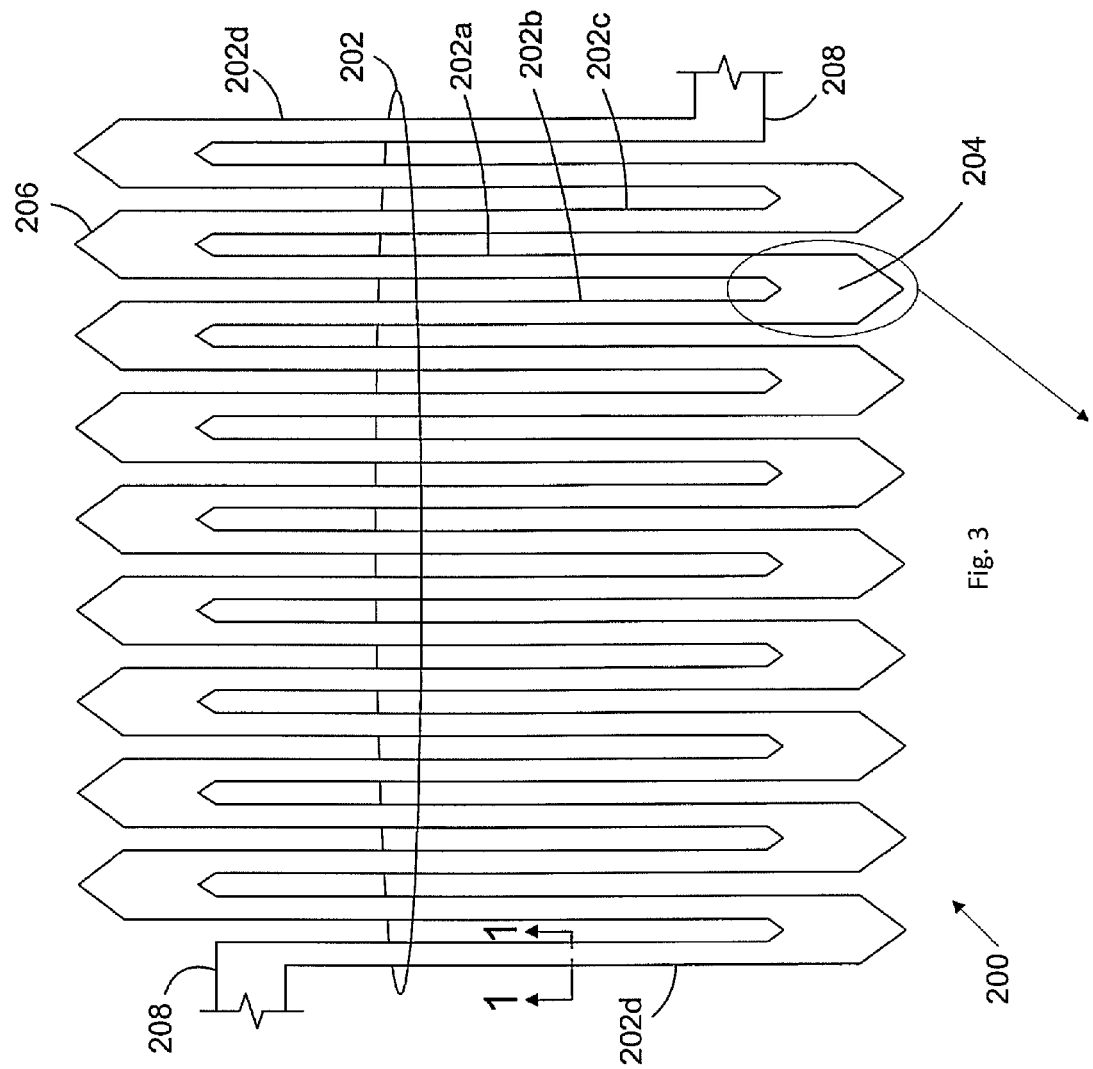
FIG. 3 depicts a serpentine-shaped magneto-resistive element as used in these teachings.

FIG. 3 depicts one embodiment of a serpentine-shaped magneto-resistive element. This may be, but is not limited to, a GMR multilayer or spin-valve resistive element (U.S. Pat. No. 7,639,005, which is Incorporated by reference herein in its entirety and for all purposes, shows a GMR multilayer serpentine). This serpentine may be oriented in x or y orientations. Resistance values may be selected to provide low power-consumption and high magneto-resistance, DR/R (change in resistance vs. applied magnetic field).

Referring to FIG. 3, the serpentine shape is formed by an array of, long, narrow and thin sensing elements 202. For ease of reference, elements 202 are described herein as lines or wires 202, without limitation as to their cross-sectional shape. Each line or wire 202 is connected at its upper and lower ends to opposite ones of its adjacent lines or wires. For example, wire 202 a has a lower connection 204 connecting to wire 202 b, and an upper connection 206 connecting to wire 202 c. In the case of the outermost wires 202 d, the ends 208 of resistor 200 connect to the circuitry (not shown) of which resistor 200 forms a part. As is conventionally known, the number, length, width and spacing of wires 202 may be varied to suit the desired resistances, circuit sizing and/or fabrication techniques for the circuit or sensor.

Figure 4:
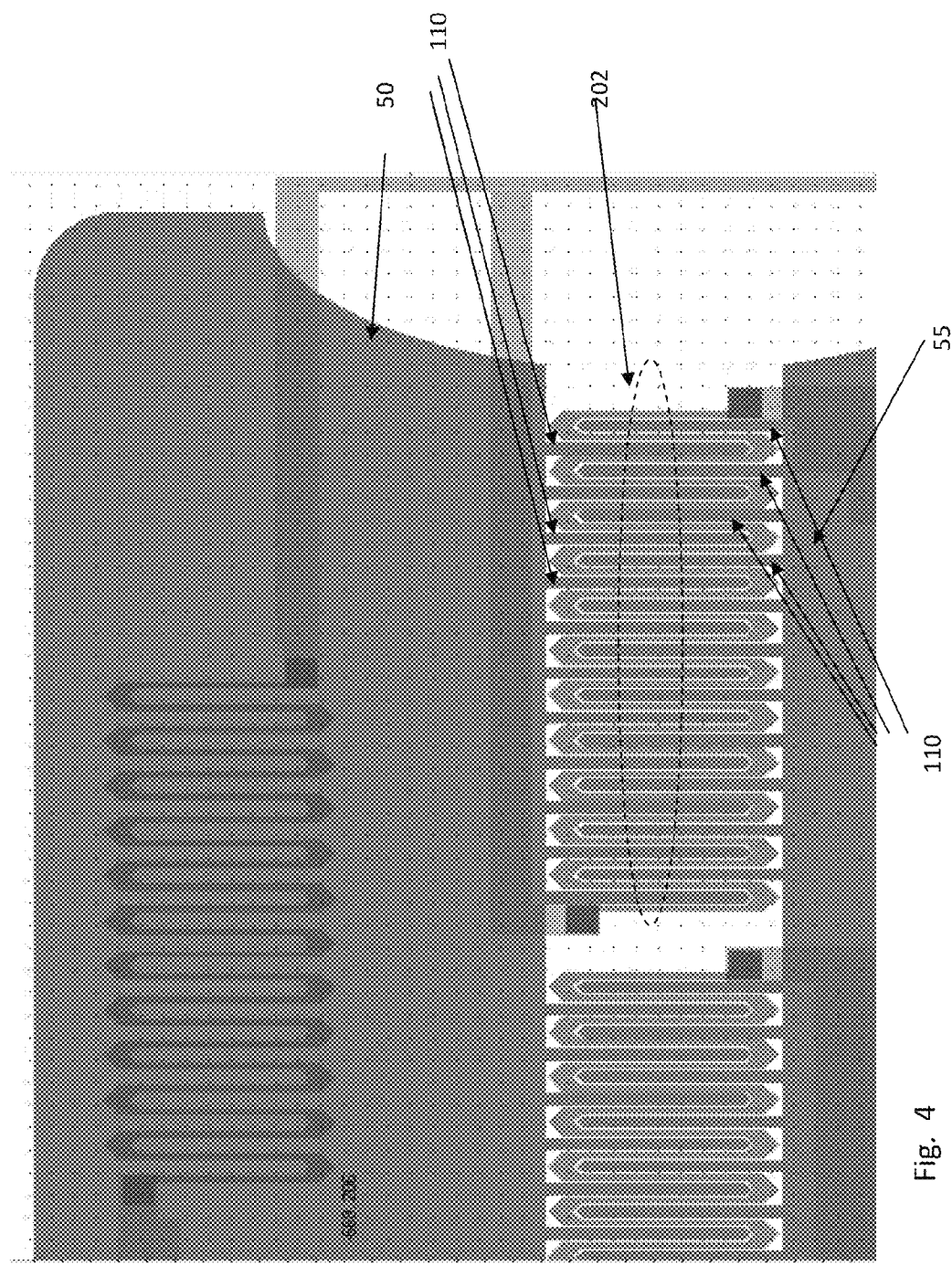
FIG. 4 depicts a close-up view of the embodiment of FIG. 1.

FIG. 4 depicts a close-up views of the combined flux-concentrator/flux-shield 50, 55, for the embodiment shown in FIG. 1, with directional flux-concentrator elements 110 interleaved with and proximate to the serpentine-shaped magneto-resistive sensing elements 202 (for the sake of clarity not all flux concentrator elements 110 are labeled). The flux concentrator elements 110 are operatively connected to the concentrator/flux-Shield 50, 55.

Figure 5:
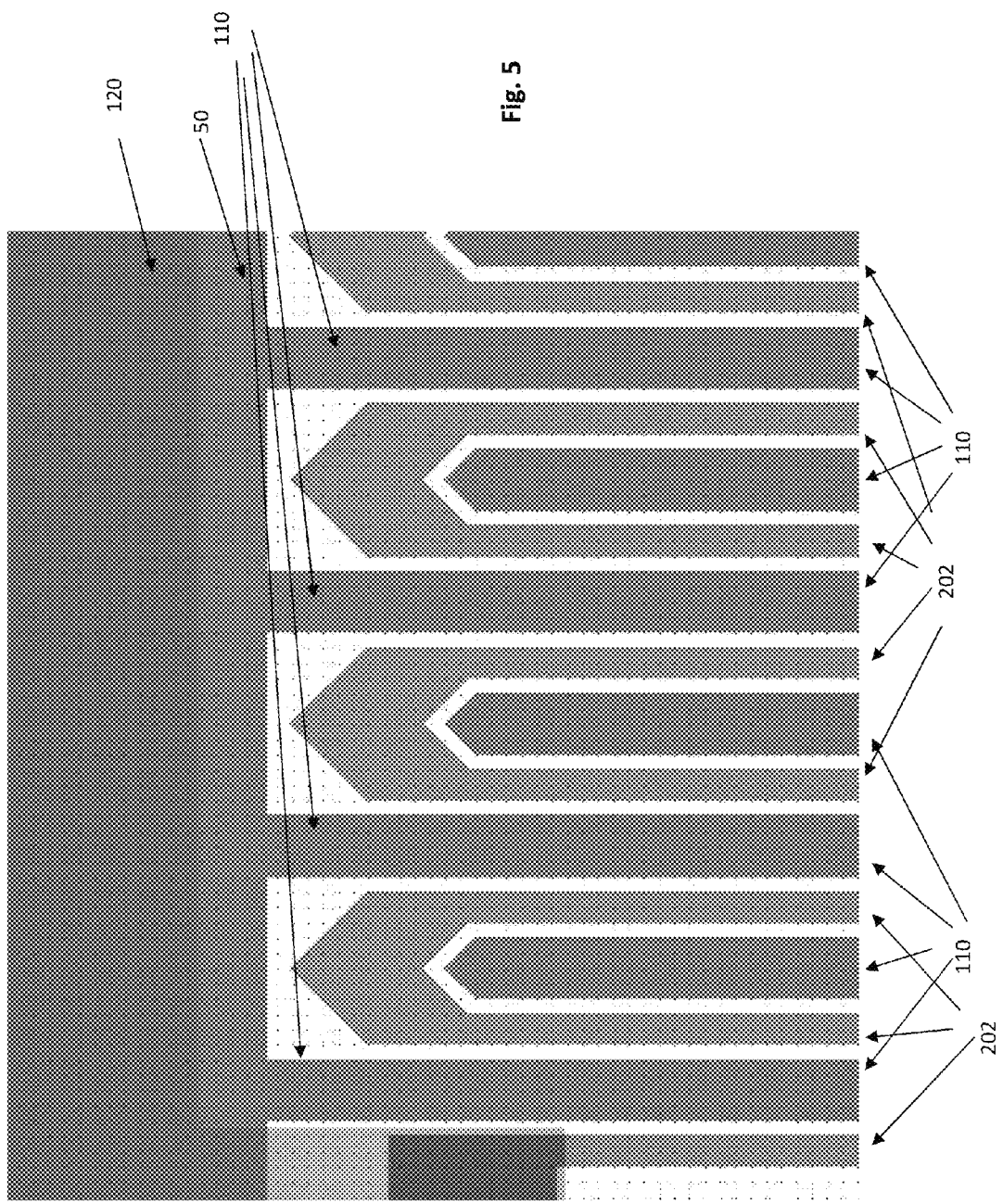
FIG. 5 depicts a close-up view of the combined flux-concentrator/flux-shield with directional flux-concentrator elements interleaved with and proximate to the serpentine-shaped magneto-resistive sensing elements of these teachings.

FIG. 5 depicts a close-up view of the combined flux-concentrator/flux-shield 50 operatively connected to the directional flux-concentrator elements 110 interleaved with and proximate to the serpentine-shaped magneto-resistive sensing elements 202 of these teachings. A connector 120, which makes an electrical connection to the magneto-resistive sensing elements 202, is also shown.

Figure 6:
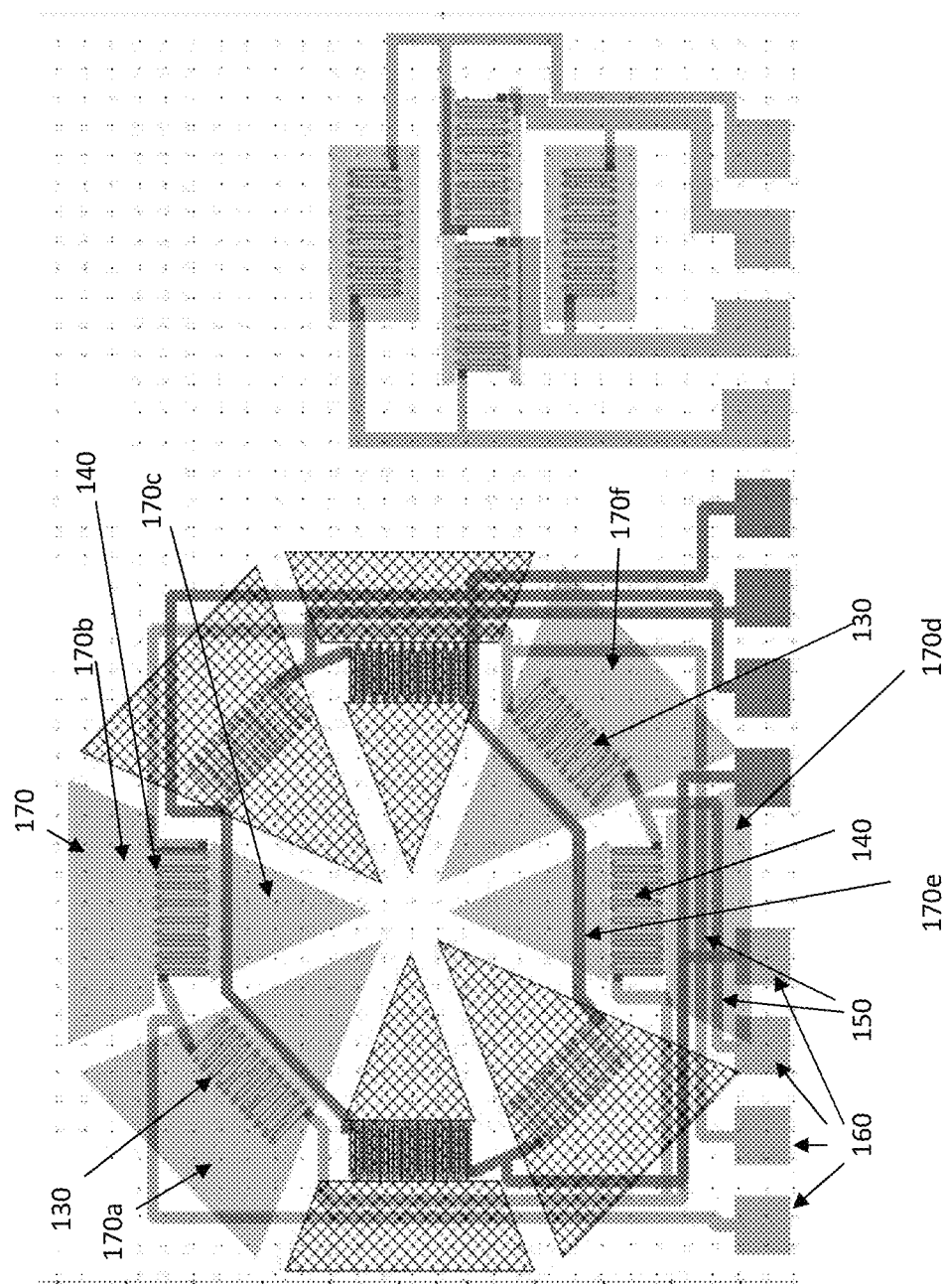
FIG. 6 depicts another embodiment of the system of these teachings.

FIG. 6 depicts another embodiment of the sensor of these teachings. This is a tri-axis magnetic compassing sensor showing integrated y and x axis and separate z-axis sensors each in a Wheatstone bridge configuration. Each sensor has two reference magneto-resistor elements 130 and two sensing magneto-resistor elements 140 connected by conductors 150 and terminated in bond pads 160 for external wiring connection. The flux-concentrators 170 act as magnetic shields to the reference magneto resistors buried beneath them. The flux-concentrators are wide at the top (remote from the sensing magneto-resistors) and narrow at the end near the sensor, providing flux-concentration. The flux concentrator narrow ends are proximate to and interleaved with the sensing magneto-resistors, providing maximum directional coupling from external field to the sensing elements.

Referring to FIG. 6, for each one of the x, y, and z-sensors, the flux concentrating/shielding structure 170 has six sections—a first section 170a disposed over the first reference resistor 130, a first magneto-resistor element 140 disposed between a second section 170b and a third section 170c; a fourth section 170d disposed over the second reference resistor 130; and a second magneto-resistor element 140 disposed between a fifth section 170e and a sixth section 170f these.

Figure 7:
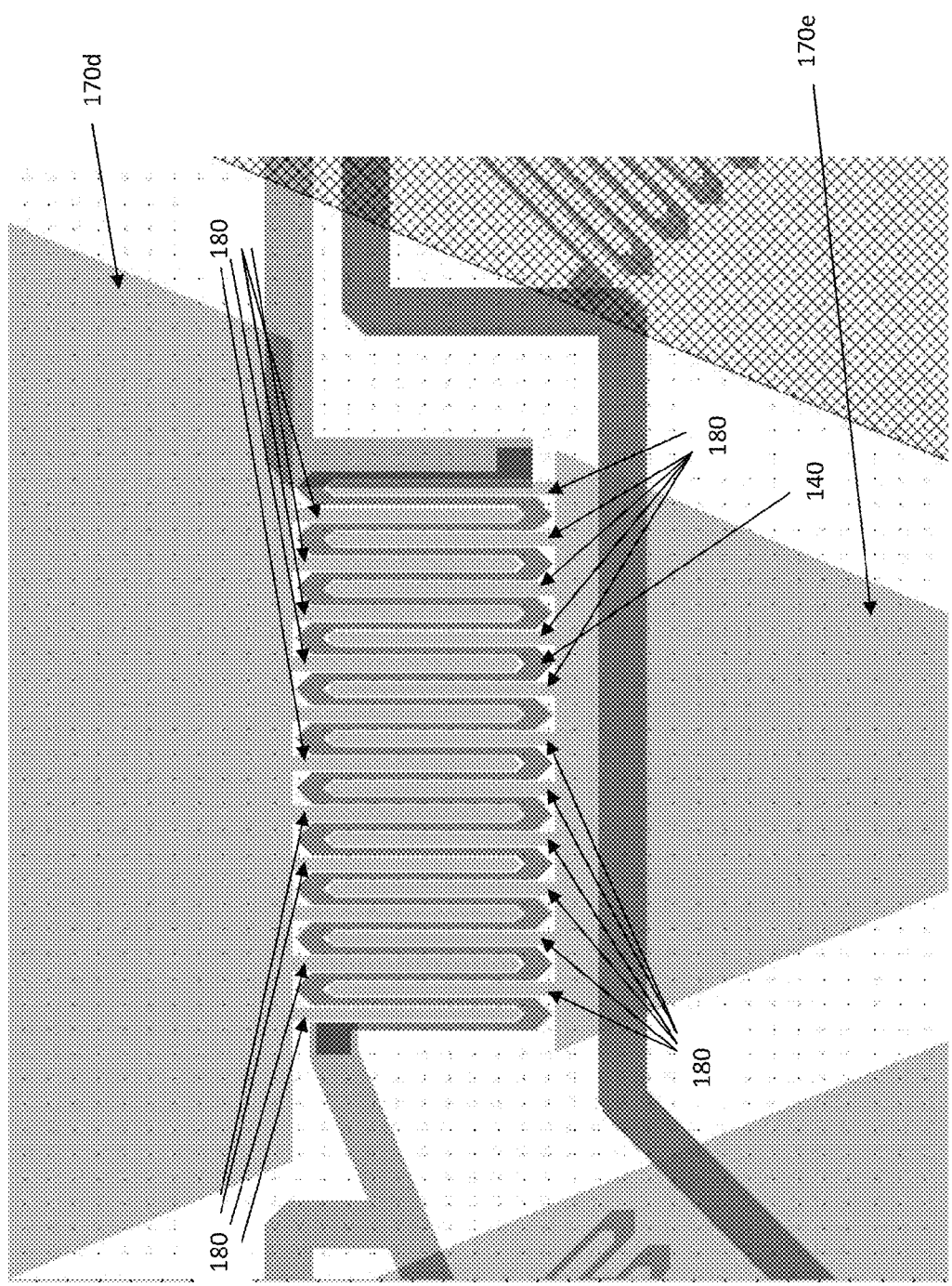
FIG. 7 depicts a close-up view of the embodiment shown in FIG. 6.

FIG. 7 depict close-up views of the embodiment of FIG. 6 combined flux-concentrator/flux-shield 170d, 170e with directional flux-concentrator elements 180 interleaved with and proximate to the serpentine-shaped magneto-resistive sensing elements 140. The directional flux concentrator elements 180 are operatively connected to the combined flux-concentrator/flux-shield 170d, 170e.

With regard to the flux-concentrator design, important design factors are flux-concentrator area and thickness, neck-down, material, interweaved flux-concentrator finger width, finger thickness, offset distance from the sensor and sidewall profile.

The flux-concentrator functions by passively coupling to external magnetic fields, collecting the magnetization and transmitting it from one region of the device to another. Flux is transmitted from the concentrator, through the sensing element and back of through the symmetrical flux-concentrator on the other side of the sensing element. Driving force for the flux conduction is the external field. Magnetic reluctances include the flux-concentrator coercivity and anisotropy fields, shape-demagnetization and flux-concentrator to sensing element gaps.

Figure 9:
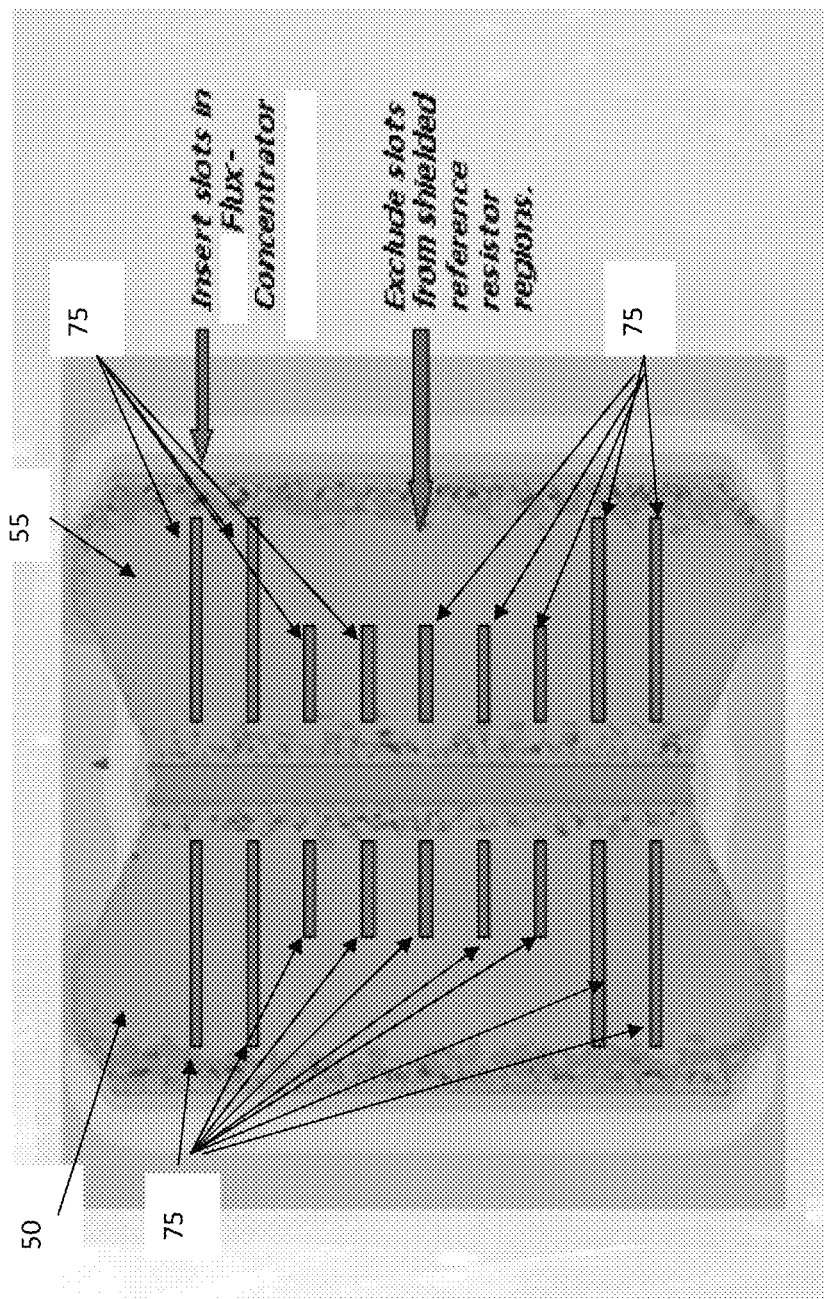
FIG. 9 depicts an embodiment of a flux-concentrator structure used in embodiments of the system of these teachings.

The interleaved flux-concentrator/sensor design provides enhanced magnetic field directionality, important for specified axis sensing. Additionally, however, the main portion of the flux-concentrator may be preferentially shaped and segmented to facilitate enhanced directional field coupling and transmission to the sensing element. In one embodiment, shown in FIG. 9, the flux concentrating/shielding structure 50, 55 has a plurality of openings (slots) 75. The openings (slots) 75 do not have soft magnetic material. No opening (slot) 75 is located in an area of the flux concentrating/shielding structure 50, 55 under which one of the two reference magneto-resistor elements is disposed.

One embodiment of the method for fabricating a magnetic field sensing component includes depositing a number of magnetic field sensing structures as line elements in an array of magnetic field sensing structures, patterning and depositing conductor elements to connect first and second ends of adjacent line elements; the connecting elements connecting the first and second ends of the adjacent line elements in order to form a substantially serpentine structure, depositing a dielectric layer to provide isolation between the magnetic field sensing structures, patterning and etching deposition vies in the dielectric layer and patterning and depositing a number of flux concentrator structures, one flux concentrator structure being deposited between each two adjacent line elements.

In one instance, the method for fabricating a magnetic field sensing component also includes depositing an encapsulation layer, patterning and etching vias in the encapsulation layer and depositing bond pads to enable external connection to the magnetic field sensing structures.

In one embodiment, magnetic field sensor fabrication sequence consists of the following generalized steps. Deposition of the sensing element materials on a planar wafer substrate surface. The substrate may be thermally oxidized silicon or a ceramic material. Good surface smoothness is required. The ferromagnetic sensing element stack (AMR, GMR, etc.) is deposited on the wafer surface, micro-lithographically patterned and etched to form resistive elements with targeted resistances and magneto-resistive response (DR/R). Electrical connections between resistive elements is achieved by microlithographically patterning and depositing conductor elements and terminations (bond pads) by lift-off processing. A dielectric gap layer is then deposited to provide electrical isolation between the sensing elements, their wiring and subsequent layers. Following the dielectric layer deposition vias are microlithographically patterned and etched. Ferromagnetic flux-concentrator/flux-shield are deposited and patterned. This may be done preferably by microlithographic patterning and through-mask electrode-position or by sheet deposition, microlithographic patterning and etching, depending upon the flux-concentrator material used. Optionally, a encapsulation layer is deposited, vias patterned and etched and bond pads deposited to allow external connection to the sensor device. In this fashion, x, y and z axis sensors can be batch-fabricated.

Figure 8:
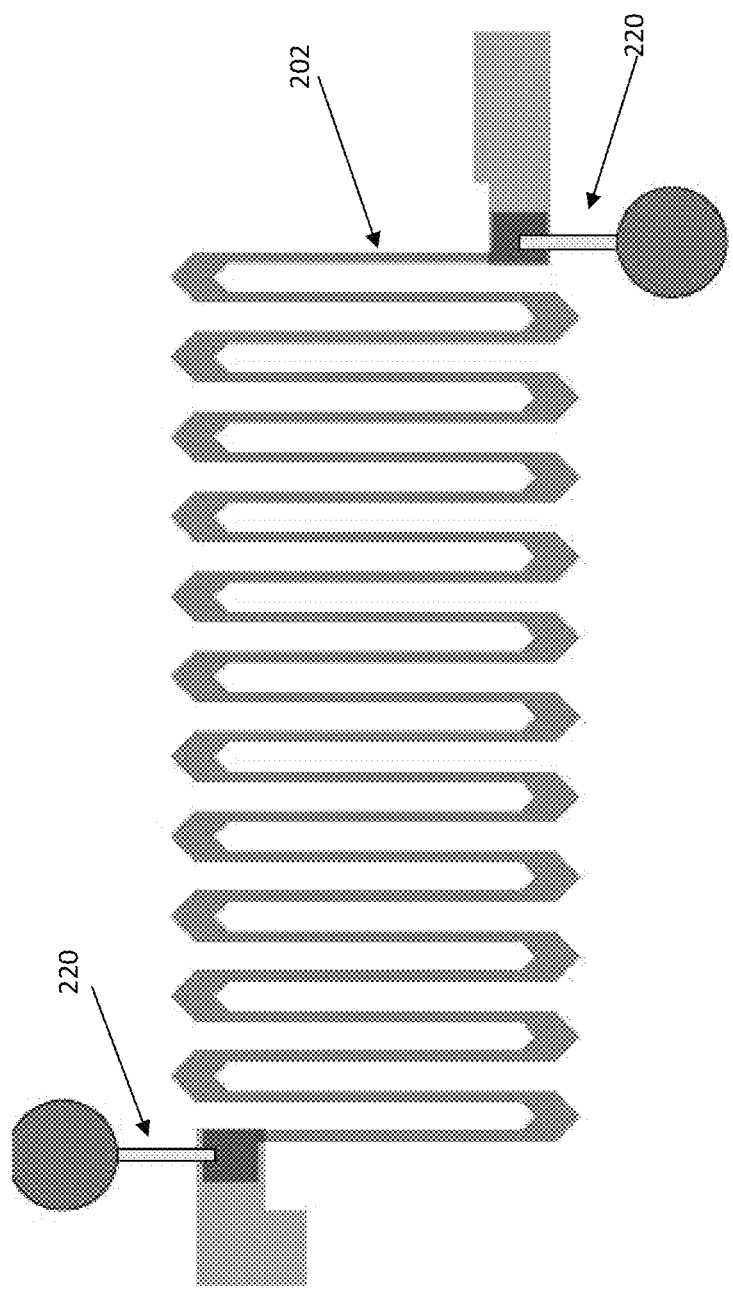
FIG. 8 depicts a serpentine-shaped magneto-resistive element with vias to the substrate with electrostatic discharge protection shunt resistors as used in these teachings.

In one instance, in order to provide electrostatic discharge protection, a shunt resistor to the substrate and a via connection are provided during fabrication. In that instance, the fabrication sequence includes patterning and etching static discharge protection vies and patterning and etching at least one shunt resistor operatively connected to the discharge protection vias. FIG. 8 shows serpentine-shaped magneto-resistive sensing elements 202 with vies to the substrate with shunt resistors 220.

Ferromagnetic sensing element stacks may consist of NiFe AMR material with Ta, NiFeCr or other underlayer/epitaxial and cap layers, GMR top or bottom synthetic spin-valves or multilayers or MTJ stacks.

Conductors may consist of an adhesion layer plus Cu, Au, Al or any other low-resistivity conductor material.

Gap layer dielectrics may be Al2O3, Si3N4, and combinations thereof or other electrically insulating materials with suitable dielectric constant and breakdown-voltage to withstand device operating conditions.

Flux-concentrators/flux shields may consist of high-permeability, low-coercivity, low-anisotropy field ferromagnetic materials such as NiFe, NiFeMo, NiFeCo, NiFeB, CoFe, CoZrTa or the like.

Encapsulation layers may consist of dielectrics, as used on the previous gap layer. Additional encapsulation layer materials may include cured polymers, such as but not limited to, polyimide (PI), or bis-cyclobutene (BCB) or cured photoresist phenolic polymer.

Bond pad materials may include Au, Cu or Al. Alternatively, the bond pad may be Cu and eutectic solder pillar bumped for flip chip assembly.

With regard to the flux-concentrator design, important design factors are flux-concentrator area and thickness, neck-down, material, interweaved flux-concentrator finger width, finger thickness, offset distance from the sensor and sidewall profile.

For the purposes of describing and defining the present teachings, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Although the invention has been described with respect to various embodiments, it should be realized these teachings are also capable of a wide variety of further and other embodiments within the spirit and scope of the appended claims.

What is claimed is:

1. A magnetic field sensing component comprising:
   a serpentine structure of line elements, the serpentine structure comprising:
      an array of line elements; each line element from the array of line elements being a magnetic field sensing structure; each line element having a first end and a second end; each first end being adjacent to another first end; each second end being adjacent to another second end; said array of line elements being part of the serpentine structure;
      first connecting elements, each first connecting element positioned to connect first ends of two adjacent line elements from the array of line elements; said first connecting elements being part of the serpentine structure;
      second connecting elements, each second connecting element positioned to connect second ends of the two adjacent line elements; said second connecting elements being part of the serpentine structure; and
      an array of flux concentrating structures; each one flux concentrating structure being disposed between two line elements from the array of line elements in the serpentine structure; wherein said each one flux concentrating structure is not disposed either over or under the serpentine structure; and wherein said each one flux concentrating structure is not disposed either over or under the first or second connecting elements.

2. The magnetic field sensing component of claim 1 wherein the magnetic field sensing structure is a giant magneto resistance (GMR) structure.

3. The magnetic field sensing component of claim 1 wherein the magnetic field sensing structure is a spin valve structure.

4. The magnetic field sensing component of claim 1 wherein the magnetic field sensing structure is a magnetic tunneling junction (MJT) structure.

5. The magnetic field sensing component of claim 1 wherein a width of each flux concentrating structure is selected to substantially optimize sensitivity of the magnetic field sensing component.

6. The magnetic field sensing component of claim 1 wherein a thickness of each flux concentrating structure is selected to substantially optimize sensitivity of the magnetic field sensing component.

7. The magnetic field sensing component of claim 1 wherein a spacing between each one flux concentrating structure and each one of the two line elements adjacent to said one flux concentrating structure is selected to substantially optimize sensitivity of the magnetic field sensing component.

8. The magnetic field sensing component of claim 1 wherein each one flux concentrating structure is offset from each one of the two line elements adjacent to said one flux concentrating structure.

9. A method for fabricating a magnetic field sensing component, the method comprising:
   depositing a number of magnetic field sensing structures as line elements in an array of magnetic field sensing structures; each line element having a first end and a second end; each first end being adjacent to another first end; each second end being adjacent to another second end;
   patterning and depositing conductor elements to connect first ends and second ends of adjacent line elements; the connecting elements connecting the first end one line element to the first end of another line element and connecting second ends of the adjacent line elements in order to form a substantially serpentine structure; said line elements and said connecting elements being part of the substantially serpentine structure;
   depositing a dielectric layer to provide isolation between the magnetic field sensing structures;
   patterning and etching deposition vias in the dielectric layer; and
   patterning and depositing a number of flux concentrator structures, one flux concentrator structure from number of flux concentrator structures being deposited between each two adjacent line elements; wherein each one flux concentrating structure is not disposed either over or under the serpentine structure; and wherein said each one flux concentrating structure is not disposed either over or under the first or second connecting elements.

10. The method of claim 9 further comprising:
    depositing an encapsulation layer;
    patterning and etching vias in the encapsulation layer; and
    depositing bond pads to enable external connection to the magnetic field sensing structures.

11. The method of claim 9 further comprising:
    patterning and etching static discharge protection vias; and
    patterning and etching at least one shunt resistor operatively connected to the static discharge protection vias.

12. A sensor comprising:
    two reference resistor elements;
    two magneto-resistor elements; each magneto-resistor element comprising:
       a serpentine structure of line elements, the serpentine structure comprising:
          an array of line elements; each line element from the array of line elements being a magnetic field sensing structure; each line element having a first end and a second end; each first end being adjacent to another first end; each second end being adjacent to another second end; said array of line elements being part of the serpentine structure;
          first connecting elements, each first connecting element positioned to connect first ends of two adjacent line elements from the array of line elements; said first connecting elements being part of the serpentine structure;
          second connecting elements, each second connecting element positioned to connect second ends of the two adjacent line elements; said second connecting elements being part of the serpentine structure; and
          an array of flux concentrating structures; each one flux concentrating structure being disposed between two line elements from the array of line elements in the serpentine structure; wherein said each one flux concentrating structure is not disposed either over or under the serpentine structure; and wherein said each one flux concentrating structure is not disposed either over or under the first or second connecting elements; and a flux concentrating/shielding structure; said flux concentrating/shielding structure disposed over the two reference resistor elements in order to substantially shield the two reference resistor elements from external fields; the two magneto-resistor elements being disposed between one portion of the flux concentrating/shielding structure and another portion of the flux concentrating/shielding structure; some of the flux concentrating structures from the array of flux concentrating structures in each magneto-resistor element being operatively connected to said one portion the flux concentrating/shielding structure and some others of the flux concentrating structures from the array of flux concentrating structures in each magneto-resistor element being operatively connected to said another portion of the flux concentrating/shielding structure.

13. The sensor of claim 12 wherein the two reference resistor elements and the two magneto-resistor elements connected to form a Wheatstone Bridge configuration, each of arm of the Wheatstone Bridge comprising one reference resistor and one magneto-resistor element; an output of the Wheatstone Bridge being provided by a voltage between points of connection of the reference resistor element and the magneto-resistor element in each arm of the Wheatstone Bridge.

14. The sensor of claim 12 wherein the two reference resistor elements are two other magneto-resistor elements.

15. The sensor of claim 12 wherein the flux concentrating/shielding structure comprises a plurality of openings; a location of any opening from the plurality of openings not being a location in an area of the flux concentrating/shielding structure under which one of the two reference resistor elements is disposed.

16. The sensor of claim 12 wherein the flux concentrating/shielding structure comprises two sections; a first section disposed over a first reference resistor and a second section disposed over a second reference resistor; the two magneto-resistor elements being disposed between the first section and the second section.

17. The sensor of claim 16 wherein a dimension of the concentrating/shielding structure in a direction substantially parallel to a line substantially perpendicular to the line elements is referred to as a width; and wherein a width of the first section near the magneto-resistor elements is smaller than a width of the first section away from the magneto-resistor elements and a width of the second section near the magneto-resistor elements is smaller than a width of the second section away from the magneto-resistor elements.

18. The sensor of claim 12 wherein the flux concentrating/shielding structure comprises six sections; a first section disposed over a first reference resistor; a first magneto-resistor element disposed between a second section and a third section; a fourth section disposed over a second reference resistor; and a second magneto-resistor element disposed between a fifth section and a sixth section.

* * * * *